United States Patent [19]

Rhodes

[11] 4,293,951

[45] Oct. 6, 1981

[54] METHOD AND APPARATUS FOR ENCODING/DECODING A CONVOLUTIONAL CODE TO A PERIODIC CONVOLUTIONAL CODE BLOCK

[75] Inventor: Smith A. Rhodes, Chantilly, Va.

[73] Assignee: Communications Satellite Corporation, Washington, D.C.

[21] Appl. No.: 21,296

[22] Filed: Mar. 16, 1979

[51] Int. Cl.³ .......................................... G06F 11/10
[52] U.S. Cl. ................................................ 371/43
[58] Field of Search .......... 340/146.1 AQ, 146.1 AV; 371/43, 44, 45

[56] References Cited

U.S. PATENT DOCUMENTS

| | | | |
|---|---|---|---|
| 3,697,947 | 10/1972 | Macy | 340/146.1 AQ |
| 3,938,085 | 2/1976 | Battail | 340/146.1 AQ |
| 3,988,677 | 10/1976 | Fletcher et al. | 340/146.1 AQ |
| 4,159,469 | 6/1979 | Zdunek | 340/146.1 AQ |

*Primary Examiner*—Charles E. Atkinson
*Attorney, Agent, or Firm*—Sughrue, Rothwell, Mion, Zinn and Macpeak

[57] ABSTRACT

In a method and apparatus for convolutionally encoding a finite length digital data bit stream, the information samples arriving at the output of each encoder shift register are fed back to its input to simulate an infinite periodic data bit stream. Recirculation of the received information and parity symbols is also used for decoding.

15 Claims, 6 Drawing Figures

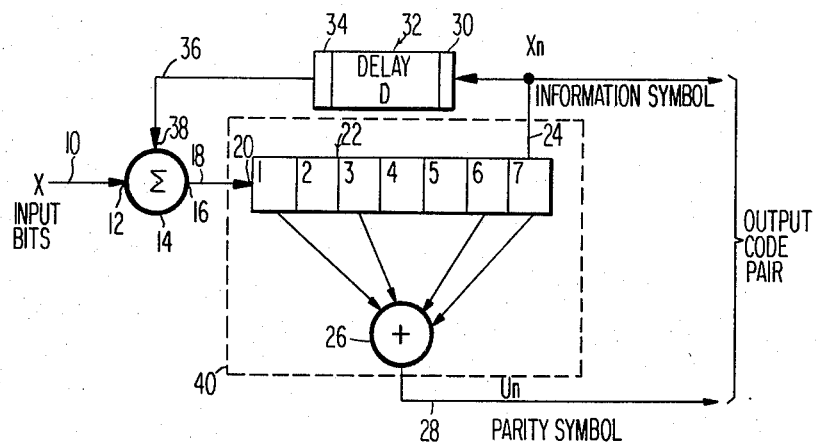

| STEP NUMBER | ENCODER CONTENTS STAGE NUMBERS | | | | | | | OUTPUT CODE SYMBOLS | |
|---|---|---|---|---|---|---|---|---|---|
| | 1 | 2 | 3 | 4 | 5 | 6 | 7 | INFO SYMBOL | PARITY SYMBOL |
| 0 | $X_0$ | $X_{B-1}$ | $X_{B-2}$ | $X_{B-3}$ | $X_{B-4}$ | $X_{B-5}$ | $X_{B-6}$ | $X_{B-6}$ | $U_{B-6}$ |
| 1 | $X_1$ | $X_0$ | $X_{B-1}$ | $X_{B-2}$ | $X_{B-3}$ | $X_{B-4}$ | $X_{B-5}$ | $X_{B-5}$ | $U_{B-5}$ |
| 2 | $X_2$ | $X_1$ | $X_0$ | $X_{B-1}$ | $X_{B-2}$ | $X_{B-3}$ | $X_{B-4}$ | $X_{B-4}$ | $U_{B-4}$ |
| 3 | $X_3$ | $X_2$ | $X_1$ | $X_0$ | $X_{B-1}$ | $X_{B-2}$ | $X_{B-3}$ | $X_{B-3}$ | $U_{B-3}$ |
| 4 | $X_4$ | $X_3$ | $X_2$ | $X_1$ | $X_0$ | $X_{B-1}$ | $X_{B-2}$ | $X_{B-2}$ | $U_{B-2}$ |
| 5 | $X_5$ | $X_4$ | $X_3$ | $X_2$ | $X_1$ | $X_0$ | $X_{B-1}$ | $X_{B-1}$ | $U_{B-1}$ |
| 6 | $X_6$ | $X_5$ | $X_4$ | $X_3$ | $X_2$ | $X_1$ | $X_0$ | $X_0$ | $U_0$ |
| 7 | $X_7$ | $X_6$ | $X_5$ | $X_4$ | $X_3$ | $X_2$ | $X_1$ | $X_1$ | $U_1$ |
| • | • | • | • | • | • | • | • | • • | • • |
| B-2 | $X_{B-2}$ | $X_{B-3}$ | $X_{B-4}$ | $X_{B-5}$ | $X_{B-6}$ | $X_{B-7}$ | $X_{B-8}$ | $X_{B-8}$ | $U_{B-7}$ |
| B-1 | $X_{B-1}$ | $X_{B-2}$ | $X_{B-3}$ | $X_{B-4}$ | $X_{B-5}$ | $X_{B-6}$ | $X_{B-7}$ | $X_{B-7}$ | $U_{B-7}$ |

FIG 4

| STEP NUMBER | ENCODER REPLICA | | | | | | | SYNDROME REGISTER | | | | | | | $X'$ | $S$ | $\hat{X}$ |
|---|---|---|---|---|---|---|---|---|---|---|---|---|---|---|---|---|---|
| | 1 | 2 | 3 | 4 | 5 | 6 | 7 | 1 | 2 | 3 | 4 | 5 | 6 | 7 | | | |
| 0 | $X_{B-6}$ | | | | | | | | | | | | | | | | |
| 1 | $X_{B-5}$ | $X_{B-6}$ | | | | | | | | | | | | | | | |
| 2 | $X_{B-4}$ | $X_{B-5}$ | $X_{B-6}$ | | | | | | | | | | | | | | |
| 3 | $X_{B-3}$ | $X_{B-4}$ | $X_{B-5}$ | $X_{B-6}$ | | | | | | | | | | | | | |
| 4 | $X_{B-2}$ | $X_{B-3}$ | $X_{B-4}$ | $X_{B-5}$ | $X_{B-6}$ | | | | | | | | | | | | |
| 5 | $X_{B-1}$ | $X_{B-2}$ | $X_{B-3}$ | $X_{B-4}$ | $X_{B-5}$ | $X_{B-6}$ | | | | | | | | | | | |
| 6 | $X_0$ | $X_{B-1}$ | $X_{B-2}$ | $X_{B-3}$ | $X_{B-4}$ | $X_{B-5}$ | $X_{B-6}$ | $A_{B-6}$ | | | | | | | | | |
| 7 | $X_1$ | $X_0$ | $X_{B-1}$ | $X_{B-2}$ | $X_{B-3}$ | $X_{B-4}$ | $X_{B-5}$ | $A_{B-5}$ | $A_{B-6}$ | | | | | | | | |
| 8 | $X_2$ | $X_1$ | $X_0$ | $X_{B-1}$ | $X_{B-2}$ | $X_{B-3}$ | $X_{B-4}$ | $A_{B-4}$ | $A_{B-5}$ | $A_{B-6}$ | | | | | | | |
| 9 | $X_3$ | $X_2$ | $X_1$ | $X_0$ | $X_{B-1}$ | $X_{B-2}$ | $X_{B-3}$ | $A_{B-3}$ | $A_{B-4}$ | $A_{B-5}$ | $A_{B-6}$ | | | | | | |
| 10 | $X_4$ | $X_3$ | $X_2$ | $X_1$ | $X_0$ | $X_{B-1}$ | $X_{B-2}$ | $A_{B-2}$ | $A_{B-3}$ | $A_{B-4}$ | $A_{B-5}$ | $A_{B-6}$ | | | | | |
| 11 | $X_5$ | $X_4$ | $X_3$ | $X_2$ | $X_1$ | $X_0$ | $X_{B-1}$ | $A_{B-1}$ | $A_{B-2}$ | $A_{B-3}$ | $A_{B-4}$ | $A_{B-5}$ | $A_{B-6}$ | | | | |
| 12 | $X_6$ | $X_5$ | $X_4$ | $X_3$ | $X_2$ | $X_1$ | $X_0$ | $A_0$ | $A_{B-1}$ | $A_{B-2}$ | $A_{B-3}$ | $A_{B-4}$ | $A_{B-5}$ | $A_{B-6}$ | $X'_0$ | $S_0$ | $\hat{X}_0$ |
| 13 | $X_7$ | $X_6$ | $X_5$ | $X_4$ | $X_3$ | $X_2$ | $X_1$ | $A_1$ | $A_0$ | $A_{B-1}$ | $A_{B-2}$ | $A_{B-3}$ | $A_{B-4}$ | $A_{B-5}$ | $X'_1$ | $S_1$ | $\hat{X}_1$ |
| 14 | $X_8$ | $X_7$ | $X_6$ | $X_5$ | $X_4$ | $X_3$ | $X_2$ | $A_2$ | $A_1$ | $A_0$ | $A_{B-1}$ | $A_{B-2}$ | $A_{B-3}$ | $A_{B-4}$ | $X'_2$ | $S_2$ | $\hat{X}_2$ |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| B+4 | $X_{B-2}$ | $X_{B-3}$ | $X_{B-4}$ | $X_{B-5}$ | $X_{B-6}$ | $X_{B-7}$ | $A_{B-8}$ | $A_{B-8}$ | $A_{B-9}$ | $A_{B-10}$ | $A_{B-11}$ | $A_{B-12}$ | $A_{B-13}$ | $A_{B-14}$ | $X'_{B-8}$ | $S_{B-8}$ | $\hat{X}_{B-8}$ |
| B+5 | $X_{B-1}$ | $X_{B-2}$ | $X_{B-3}$ | $X_{B-4}$ | $X_{B-5}$ | $X_{B-6}$ | $X_{B-7}$ | $A_{B-7}$ | $A_{B-8}$ | $A_{B-9}$ | $A_{B-10}$ | $A_{B-11}$ | $A_{B-12}$ | $A_{B-13}$ | $X'_{B-7}$ | $S_{B-7}$ | $\hat{X}_{B-7}$ |
| B+6 | $X_0$ | $X_{B-1}$ | $X_{B-2}$ | $X_{B-3}$ | $X_{B-4}$ | $X_{B-5}$ | $A_{B-6}$ | $A_{B-6}$ | $A_{B-7}$ | $A_{B-8}$ | $A_{B-9}$ | $A_{B-10}$ | $A_{B-11}$ | $A_{B-12}$ | $X'_{B-6}$ | $S_{B-6}$ | $\hat{X}_{B-6}$ |
| B+7 | $X_1$ | $X_0$ | $X_{B-1}$ | $X_{B-2}$ | $X_{B-3}$ | $X_{B-4}$ | $X_{B-5}$ | $A_{B-5}$ | $A_{B-6}$ | $A_{B-7}$ | $A_{B-8}$ | $A_{B-9}$ | $A_{B-10}$ | $A_{B-11}$ | $X'_{B-5}$ | $S_{B-5}$ | $\hat{X}_{B-5}$ |
| B+8 | $X_2$ | $X_1$ | $X_0$ | $X_{B-1}$ | $X_{B-2}$ | $X_{B-3}$ | $A_{B-4}$ | $A_{B-4}$ | $A_{B-5}$ | $A_{B-6}$ | $A_{B-7}$ | $A_{B-8}$ | $A_{B-9}$ | $A_{B-10}$ | $X'_{B-4}$ | $S_{B-4}$ | $\hat{X}_{B-4}$ |
| B+9 | $X_3$ | $X_2$ | $X_1$ | $X_0$ | $X_{B-1}$ | $X_{B-2}$ | $A_{B-3}$ | $A_{B-3}$ | $A_{B-4}$ | $A_{B-5}$ | $A_{B-6}$ | $A_{B-7}$ | $A_{B-8}$ | $A_{B-9}$ | $X'_{B-3}$ | $S_{B-3}$ | $\hat{X}_{B-3}$ |
| B+10 | $X_4$ | $X_3$ | $X_2$ | $X_1$ | $X_0$ | $X_{B-1}$ | $A_{B-2}$ | $A_{B-2}$ | $A_{B-3}$ | $A_{B-4}$ | $A_{B-5}$ | $A_{B-6}$ | $A_{B-7}$ | $A_{B-8}$ | $X'_{B-2}$ | $S_{B-2}$ | $\hat{X}_{B-2}$ |
| B+11 | $X_5$ | $X_4$ | $X_3$ | $X_2$ | $X_1$ | $X_0$ | $A_{B-1}$ | $A_{B-1}$ | $A_{B-2}$ | $A_{B-3}$ | $A_{B-4}$ | $A_{B-5}$ | $A_{B-6}$ | $A_{B-7}$ | $X'_{B-1}$ | $S_{B-1}$ | $\hat{X}_{B-1}$ |

METHOD AND APPARATUS FOR ENCODING/DECODING A CONVOLUTIONAL CODE TO A PERIODIC CONVOLUTIONAL CODE BLOCK

BACKGROUND OF THE INVENTION

1. Field Of The Invention

This invention relates to conventional convolutional coding methods and apparatus and, more particularly, to a method and apparatus for encoding and decoding a finite length digital data bit stream to a Periodic Convolutional Code Block (PCCB) format, which eliminates the overhead bits required for conventional convolutional encoding and decoding of a digital data bit stream of finite length.

2. Description of The Prior Art

Historically, conventional convolutional codes were first disclosed in the publication by Elias, P., "Coding for Noisy Channels," *I.R.E. Conv. Record*, 1955, Pt. 4, pages 37–46. Excellent treatment of convolutional code theory and apparatus for implementing the code can be found in several publications, including Berlekamp, E. R., *Algebriac Coding Theory*, McGraw-Hill Book Co., New York, 1968, pages 388–394, and Peterson, W. W., and Weldon, Jr., E. J., *Error-Correcting Codes*, 2d Ed., The MIT Press, Cambridge, Mass., 1972, pages 392–448.

It is well known in the coding art that conventional convolutional coding and decoding works best when the digital data bit stream is of infinite duration or length. However, when the digital data bit stream is of finite length, both encoding and decoding of a conventional convolutional code requires overhead bits to trick the respective conversion process into thinking the digital data bit stream is of an infinite length. This results in a waste of transmission capacity.

A very brief description of convolutional encoding may be helpful. In FIG. 1, the components within block 40 make up a conventional convolutional encoder of the type described at pages 390 and 305, respectively, of the above-mentioned publications.

The digital data bit stream of finite length to be encoded in PCCB format, designated generally by the reference letter X, is applied via a line 10 to a first input 12 of a selection device 14. The output signal at output 16 of selection device 14 is applied via a line 18 to an input stage 20 of a shift register 22. The last stage of shift register 22 is connected to a line 24 which provides the encoded information symbols, designated generally by the reference letter $X_n$, of the output PCCB code pairs.

A plurality of individual taps are provided for specific stages of shift register 22 in conformance with the generator polynomial of the particular conventional convolutional code being employed to generate the parity symbols, as is well known in the art. Specifically, for illustrative purposes only, an individual tap is provided for stages 1, 3, 6 and 7 of shift register 22, although tap placement is determined by orthogonality requirements in each particular case. These taps, in turn, are connected to inputs of a modulo-2 adder 26. The output of modulo-2 adder 26 is applied to a line 28. The output signals on line 28 are the parity symbols, designated generally by the reference letter $U_n$, of the output pairs of the PCCB.

In the illustrative PCCB encoder apparatus shown in FIG. 1, the conventional convolutional code being employed has a constraint length $K=7$ and a code rate $\rho=\frac{1}{2}$, since for each information symbol $X_n$ there is a corresponding parity symbol $U_n$. (Code rate $\rho$ is defined as the ratio of the number of information symbols K to the corresponding number of convolutional code symbols N in a constraint length). This convolutional code is a simple one.

Each time the data in register 22 is shifted, a new parity symbol and information symbol are outputted. Thus, K different parity symbols are generated corresponding to the K different positions of each bit within the register. These parity symbols are used to decode that information bit. Since the generation of parity symbols does not begin until register 22 is full, the first K bits only contribute to a few of the parity symbols, i.e., the first bit contributes to the first parity symbol, the second bit to the first two parity symbols, etc.

Similarly, at the end of the incoming bit stream, a parity symbol is generated with the $B^{th}$ bit, where B is the length of the finite bit stream, in the input stage of the shift register but no more information is available to generate parity symbols with the last K information bits at each of the K shift register positions. The result is that dummy bits must be supplied at the beginning and/or end of the bit stream to generate the required number of parity symbols for each information symbol. The required overhead bits must be equal to or greater than the smaller of two numbers K and R, the constraint length of the conventional convolutional code measured in information symbols K or parity symbols $R=N-K$. These overhead bits S must be considered surplusage in the sense that they carry no information content in themselves. When a low-performance conventional convolutional code having small values of either K or R is being used, the required S overhead bits are not that detrimental to the overall system performance. When, however, a high-performance conventional convolutional code having a very long constraint length (K and $R=N-K$ are both large) is being used, the required S overhead bits become very detrimental to system performance. This becomes especially noticeable when short bursts of digital data information bits are being sent using a very high-performance conventional convolutional code. Such is the case in satellite communications, for example, where time division multiple access (TDMA) transmissions of short burst length are using very high-performance conventional convolutional codes to achieve high information rate communications with low probabilities of bit error after FEC decoding. In such satellite communication systems, the required overhead bits S for each TDMA burst are very detrimental to system performance. For example, when a very high-performance rate $\frac{7}{8}$ conventional convolutional code having a constraint length of $K=336$ information bits and $R=48$ parity symbols is being used, the minimum number of overhead bits S required for a TDMA burst of 336 or more information data bits is equal to $R=48$. In other TDMA conventional convolutionally encoded burst schemes, from 20–100 overhead bits S are required for each burst. It is, therefore, apparent that these required overhead bits S are very detrimental to the TDMA system performance.

SUMMARY OF THE INVENTION

It is an object of this invention to eliminate the overhead bits S required to conventionally convolutionally encode and decode a digital data bit stream of finite length.

It is another object to convert the finite length conventional convolutionally coded bit stream to a PCCB format and to use certain binary symbols in the PCCB to encode or decode certain other binary symbols in the PCCB.

It is a further object to make the code rate and performance and the encoder and decoder complexity a function only of the underlying conventional convolutional code being used and to make these independent of the block length B of the PCCB format.

It is another object to make the block length B of the PCCB format adjustable to values of $2K+mk$, where $\rho=k/n$ is the code rate of the underlying conventional convolutional code being used and m is any non-negative integer. Thus, the block length may be varied in steps of k bits. The minimum length of 2K is preferred to avoid changing the properties of the underlying convolutional code when it is used for PCCB coding.

Briefly, these and other objects are achieved by recirculating the output of the shift register back to the input thereof with an adjustable delay equal to $B-K$ so that the proper parity symbols for the first K bits can be generated as the last K bits are being fed through the register. Thus, only useful information bits are employed in generating the parity symbols.

In the general case, the encoder according to the present invention includes a standard encoder having k "subencoders" of the type shown in FIG. 1 operating in parallel and each having a constraint length $K_1$. Thus, for a bit stream of finite block length B, each subencoder must handle $B_1=B/k$ bits.

It should be noted that this standard encoder defines the constraint length $K=kK_1$ of the underlying conventional convolutional code of rate $\rho=k/n$ being used in the PCCB format. The digital data is applied to the encoder as k parallel bit streams. Each of these streams is first input to an adder stage. The output of the adder stage is applied to the input stage of one of the k shift registers of the standard encoder. Various stages of the k shift registers are connected to $r=n-k$ modulo-2 adder stages (in conformance with the convolutional code generator polynomial), which produce the parity symbols of the conventional convolutional code as is well known in the art. The output stage of each shift register is connected to a delay register whose output stage is connected to the second input of the adder stage. Thus, each of the k digital data bit streams is delayed and fed back on itself. This delay and feedback eliminates the required overhead bits required to encode a conventional convolutional code. The delay $D_1$ introduced by the delay stages must satisfy the equation $D_1=B_1-K_1$, where $B=kB_1$ is the length of the finite digital data bit stream input and also the length of the PCCB format being produced and $K=kK_1$ is the constraint length of the underlying conventional convolutional code. It should be noted that $B \geq K$. For PCCB performance to be equal to that of the original convolutional code, $B \geq 2K$ may be required. Thus, $B=2K+mk$ are the allowable lengths for the finite data stream that is encoded, where m is any positive integer. The PCCB format can begin being generated once each of the K shift registers is full or, in other words, after the first $K=kK_1$ bits have been fed into the decoder. The output of each shift register is fed back via a suitable delay to its input so as to arrive at the shift register input when the stream of bits into that shift register has ended. The first $K_1$ bits are again supplied to the shift register and, thereafter, a block of k information symbols and $r=n-k$ parity symbols in PCCB format is output for each input block of k bits of the digital data bit stream until the entire digital data bit stream has been encoded into PCCB format.

The method and apparatus for decoding the PCCB format also includes a standard decoder for a conventional convolutional code. As an example of a standard decoder, a majority decoder for an FEC code of rate $\rho=k/n=\frac{1}{2}$ (is shown in box 100 of FIG. 3). Since $k=1$, the total delay $D=D_1$ and the constraint length is $K=K_1$. Also, the number of bits encoded per PCCB block is $B=B_1$. The stages of the PCCB decoder shown in FIG. 3 must also satisfy the equation $D_1=B_1-K_1$ used by the PCCB encoder for the FEC code of rate $\frac{1}{2}$ that is generated at the other end of the transmission link. The $k=1$ information symbol and the $r=n-k=1$ parity symbol of each detected code block is applied to the first input of an selection device 56 and to the first input of an selection device 74, respectively. The output of selection device 56 is applied to the input stage of the encoder replica register of the standard decoder. The output stage of the encoder replica register is delayed a period of $D_1$ bits and fed back to the input stage of the encoder replica register using a delay register 118. The detected parity symbols at the output of selection device 74 are fed to the input stage of a delay register 80 having $K_1$ stages. The output stage of register 80 is delayed a period of $D_1$ bits and fed back to its input stage using a delay register 112. Thus, the detected information symbols and the detected parity symbols of the PCCB are delayed and fed back on themselves. This delay and feedback of the detected information and parity symbol pairs of the PCCB eliminates the overhead bits required to decode a conventional convolution code. Typically, PCCB format decoding begins when the first detected information symbol of the detected PCCB pairs reaches the output stage of the encoder replica register. Thereafter, the detected and corrected decoded digital data bit stream is output in its original order from the output of the standard convolutional code decoder.

The novel features of the invention are set forth with particularly in the appended claims. The invention will best be understood from the following description when read in conjunction with the accompanying drawings.

BRIEF DESCRIPTION OF THE DRAWINGS

FIG. 1 is a general block diagram of the novel encoder for converting a digital data bit stream to the PCCB format of the present invention.

FIG. 2 is a diagram illustrating the contents and corresponding outputs of the PCCB encoder of FIG. 1 for a complete block cycle of $B_1=D_1+K_1$ information bits.

FIG. 4 is a diagram illustrating the contents and corresponding outputs of the PCCB decoder of FIG. 3 for a complete block cycle of $B_1=D_1+K_1$ information bits.

DESCRIPTION OF THE PREFERRED EMBODIMENT

Figure 3:
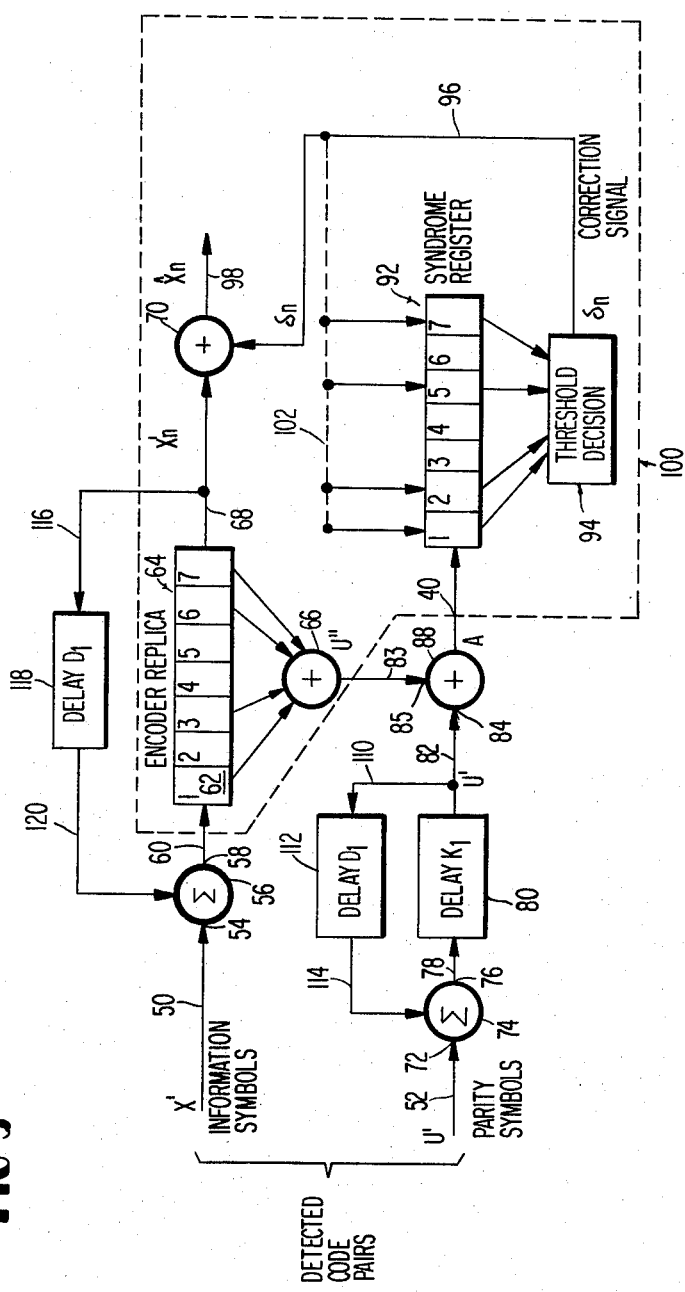
FIG. 3 is a block diagram of the novel decoder for decoding PCCB's format information and parity symbol pairs back to the input digital data bit stream present at the input of the PCCB encoder above.

Referring again to FIG. 1, the encoder apparatus for the method of converting a digital data bit stream to the PCCB format of the present invention is shown.

Although the encoder of FIG. 1 has a constraint length $K=7$ and code rate $p=\frac{1}{2}$, it should be noted that the apparatus and method of the present invention are equally applicable to higher-performance conventional convolutional codes having substantially longer constraint lengths and higher or lower code rates, and also are equally applicable to conventional convolutional codes utilizing the Viterbi algorithm.

As shown in FIG. 1, the output stage of shift register 22 is connected to input stage 30 of a delay serial shift register 32. Delay element 32 has $D_1$ stages, where $D_1$ is defined by:

$$D_1 = B_1 - K_1 \tag{1}$$

where,
- $B$ = length of the finite digital data bit stream to be encoded to PCCB format;
- $K$ = constraint length of the underlying conventional convolutional code being used in the PCCB format;
- $B_1 = B/k$ is the amount of the bit stream length B which must be handled by each of the K parallel operating subencoders; and
- $K_1 = K/k$ is the number of stages of each subencoder shift register.

The last stage 34 of the shift register 32 is connected via a line 36 to a second input 38 of selection device 14. Delay element 32 thus delays for a period of $D_1$ bits and then via the selection device 14 effects feedback of the contents of delay element 32 to the input stage the information symbols $X_n$ from the output stage of shift register 22. This delay and feedback of the information symbols $X_n$ of the conventional convolutional code being employed produces the PCCB format of the present invention.

Selection device 14 operates such that recirculated information bits arrive at the input to shift register 22 just as the input stream of $B_1$ bits is ending. The first $K_1-1$ information symbols are then re-introduced to shift register 22. Thus, the parity symbols for the first $K_1-1$ shift register positions of the first information symbol are generated simultaneously with the parity symbols corresponding to the last $K_1-1$ register positions of the $B_1^{th}$ symbol, the first $K_1-2$ parity symbols for the second information bit are generated with the last $K_1-2$ parity symbols of the $(B_1-1)^{th}$ information symbol, etc. After the first symbol again reaches the output of the register, the position at which parity symbol generation began, encoding is complete and the contents of registers 22 and 32 are dumped.

As is apparent, the encoder has been "tricked" into seeing an infinite bit stream of periodicity $B_1$, but no surplus bits have been added to the stream and system transmission capacity is not reduced.

It is only necessary that $B_1 \geq K_1$ be satisfied for the system to function properly, but it is preferable that $B_1 \geq 2K_1$ be satisfied so that the same information symbol will not at any time exist at two locations in the shift register. It should be especially noted that, unlike a conventional block code, the length B of a PCCB format is almost independent of the underlying code and is determined solely by the length of the finite digital data bit stream to be encoded. Therefore, by providing an adjustable delay D, the block length B of the PCCB format may be easily varied in multiples of k bits to accommodate multiple TDMA transmission with different burst lengths. Permissible values for B are $B = 2K + mk$, where $m = 0, 1, 2, \ldots$ Encoding by PCCB can in principle begin at any point in the input digital data bit stream. As is shown later, in terms of preferred order decoding, it is desirable to decode the B information bits of the PCCB beginning with the $X_o$ information bit and ending with the final $X_{(B-1)}$ information bit of the PCCB sequence in order that the decoded digital data bit stream is in its original sequence. Therefore, to achieve this decoding sequence, the preferred sequence of PCCB encoding is to start with the $X_{[B-(K-1)]}$ digital data bit and to end with the $X_{(B-K)}$ digital data bit.

Turning now to FIG. 2, the method of PCCB encoding a complete block of B digital data bits is shown. Initially, the entire block of B digital data bits is loaded into the PCCB encoder apparatus, with the $X_1 \rightarrow X_{(B-K)}$ digital data bits being loaded serially into the delay shift register 32 and the $X_{[B-K-1]} \rightarrow X_o$ digital data bits being loaded serially into the shift register 22. As stated above, PCCB format encoding can begin at any point in the digital data bit stream. The starting point for PCCB encoding used in FIG. 2 is for purposes of a desired sequence of PCCB decoding. At step O, the encoded PCCB pairs are the $X_{[B-K-1]} = X_{B-6}$ information symbol and the $U_{[B-K-1]} = U_{B-6}$ parity symbol. The sequence of PCCB encoding continues as shown in FIG. 2. The last encoded PCCB pair at step $[B-1]$ are the $X_{[B-K]} = X_{B-7}$ information symbol and the $U_{[B-K-1]} = U_{B-7}$ parity symbol.

Turning now to FIG. 3, the decoder apparatus for the method of converting the detected PCCB symbol pairs to the digital data bit stream of the present invention is shown.

The detected PCCB code pairs consisting of $X'$ information symbols and $U'$ parity symbols are applied to lines 50, 52, respectively. As stated above, PCCB decoding can begin with any PCCB symbol pair as long as the proper order of the symbols is observed. However, for illustrative purposes only, assum that the detected PCCB symbols are decoded in the order they are received. Line 50 applies the information symbols $X'$ of the detected PCCB pairs to a first input 54 of selection device 56. The selection device 56 is similar in function to that of selection device 14 illustrated in FIG. 1 and previously described. The output 58 of selection device 56 is connected via a line 60 to an input stage 62 of an encoder replica shift register 64. It should be noted that those devices within box 100 comprise the elements of a standard majority logic decoder for a conventional convolutional code. The length of encoder replica shift register 64 is equal to the constraint length K of the underlying conventional convolutional code of the PCCB format. Encoder replica shift register 64, as shown, has seven stages and has four taps connected to a modulo-2 adder 66 in a sequence identical to the tap sequence of shift register 22 of the encoder of FIG. 1. These tap connections are determined by the generator polynominal of the underlying conventional convolutional code as is well known in the art. The last stage of encoder replica shift register 64 is connected to a line 68. The signal on line 68 has the detected information symbols $X'_n$. These information symbols $X'_n$ are applied to the first input of an adder stage 70, as is well known in the art.

The detected parity symbols U' of the PCCB are applied via line 52 to an input 72 of a selection device 74, similar to selection device 64, and to selection device 14 of FIG. 1. The output 76 of selection device 74 is connected via a line 78 to an input of a delay shift register 80. Delay shift register 80 has a number of stages equal to K, the constraint length of the underlying conventional convolutional code being employed in the PCCB. The output of delay shift register 80 is connected via a line 82 to an input 84 of an adder stage 86. The output signal of modulo-2 adder 66 is connected via a line 83 to an input 85 of adder stage 86. In this way, the received parity symbol is compared to a parity symbol regenerated from the detected information symbols. If they are the same, a binary "0" will result. The output 88 of adder stage 86 is applied via a line 90 to an input stage of a syndrome shift register 92. Syndrome shift register 92, as shown, has seven stage and has four taps connected to a threshold decision circuit 94 in a sequence which is a mirror image of the sequence of the tap connections of the shift register 22 of the encoder shown in FIG. 1. Such a tap connection scheme is well known in the art in order to employ the detected parity symbols to check and correct the detected information symbols. When register 92 is full, logic 94 decides whether or not the information symbol presently existing at 68 should be corrected. The output of threshold decision circuit 94 having correction signal $\delta_n$ is connected via a line 96 to an input of adder stage 70. The output signal of adder stage 70, which is applied to a line 98, contains the corrected, decoded information bits $\hat{X}_n$ of the digital data bit stream.

As is apparent to those skilled in the coding art, the part of the decoder apparatus in FIG. 3 enclosed by dashed lines 100 is a general-type direct threshold decoder for a conventional convolutional code. Such a decoder is disclosed, for example, in the Berlekamp reference, supra, at page 391, and in the Peterson et al. reference, supra, at page 399. When the feedback connections shown by dash-dot line 102 are provided for syndrome register 92, the decoder of dashed lines 100 becomes a general-type feedback threshold decoder for a conventional convolutional code, which is also disclosed in the above two references.

The decoder shown in FIG. 3 becomes a PCCB decoder by the addition of three delay shift registers. Specifically, a line 116 connects the output stage of encoder replica shift register 64 to an input of a delay shift register 118. Delay shift register 118 has D stages, where D is the same value as the D value of delay shift register 32 of the PCCB encoder. The last stage of delay shift register 118 of the PCCB decoder is connected via a line 120 to an input of adder stage 56. Thus, the detected information symbols X' are delayed and fed back.

Delay shift register 80, as described above, is connected between selection device 74 and adder stage 86. Delay shift register 80 has K stages, K being the constraint length of the underlying conventional convolutional code being used in the PCCB format. The output stage of delay shift register 80 is connected via a line 110 to an input stage of a delay shift register 112. Delay shift register 112 has D stages, where D is the same value as the D value of delay element 32 of the PCCB encoder. The last stage of delay shift register 112 of the decoder is connected via a line 114 to an input of selection device 74.

As stated above with respect to the PCCB encoder of the present invention, delay and feedback of the detected symbol pairs in PCCB results in the elimination of the overhead bits required to decode a conventional convolutional code sequence of finite length without resulting in a decrease in decoding accuracy and an increase in transmission time.

The method of decoding PCCB using the decoder apparatus of FIG. 3 is shown in the diagram of FIG. 4. As stated above, PCCB decoding can begin with any PCCB symbol pair as long as the proper order of the symbols is observed. However, for illustrative purposes only, assume that the detected PCCB symbols are decoded in the order they are received. At step 0, the first stage of encoder replica shift register 64 has stored detected information symbol $X'_{B-6}$, the first information symbol to be output by the PCCB encoder. Also at stage 0, the first stage of delay shift register 80 has stored parity symbol $U'_{B-6}$ (not shown), the first parity symbol to be output by the PCCB encoder. By step 6, encoder replica shift register 64 has stored information sybmols $X'_o \rightarrow X'B-6$, and delay shift register 80 has stored parity symbols $U_o' \rightarrow U_{B-6}'$ (not shown). At step 6, syndrome shift register 92 is provided with the first parity check $A_{B-6}$, formed by the addition of regenerated parity symbol $U''_{B-6}$ and detected parity symbol $U'_{B-6}$. When step 12 is reached, the syndrome register is storing parity checks $A_\sigma \rightarrow A_{B-6}$, allowing the threshold decision stage 94 to generate the correction signal $\delta_o$. Similarly, at step 12, the information symbol $X'_o$ is at the last stage of encoder replica shift register 64. Thus, at step 12, information symbol $X'_o$ is applied to adder stage 70 for comparison with correction signal $\delta_o$. When this comparison is made, the output of adder stage 70 provides the first detected, corrected information bit $\hat{X}_o$ of the decoded digital data bit stream. This PCCB decoding sequence is repeated until step B+11, whereupon the entire PCCB block has been decoded in the original digital data bit stream sequence of $\hat{X}_o \rightarrow \hat{X}_{B-1}$, as shown in the diagram of FIG. 4.

As was stated above, the method of decoding PCCB can in principle begin at any point in the stream of B information bits. However, since it was desired to decode the B information bits of the PCCB sequence beginning with the $X_o$ bit and ending with the final $X_{(B-1)}$ bit of the block digital bit stream, the decoding sequence shown in FIG. 4 is required.

As stated above, the size of each block of PCCB format data is equal to B, the number of bits in the finite digital data bit stream. The delay D must satisfy the equation:

$$D = B - K \text{ information bits} \qquad (2)$$

where,
B = length of the finite digital data bit stream to be decoded; and
K = constraint length of the underlying conventional convolutional code being used in the PCCB format.

In general, $D_1 = B_1 - K_1$, where $B_1 = B/k$, $K_1 = K/k$, $D_1 = B - K$ for $\rho = k/n = \frac{1}{2}$ or $k = 1$. It should be noted that the K, D and B value of the PCCB decoder must be equal to the corresponding value for the same variable in the PCCB encoder. However, these values can be changed for each TDMA burst, allowing the length of the PCCB to be varied over a much broader range than that possible with conventional block codes.

As stated in equation (2) above, the value of B and K must satisfy the inequality $B \geq K$ bits. It has been discovered by the inventor that in PCCB decoding the code rate and code detection/correction performance are functions only of the underlying conventional convolutional code being used and are independent of the burst length B of the PCCB format. Furthermore, except for the additional required delay shift registers, the decoder complexity is a function of the underlying convolutional code and is independent of the burst length B of the PCCB. Actual tests by the inventor have shown, however, that when $B < 2K$, there is a decrease in performance of the underlying conventional convolutional code detection and correction. This decrease, which is present with either direct or syndrome-feedback decoding, is caused by the absence of the required degree of orthogonality between the symbols being decoded when a symbol is present in the register at two different positions. Thus, for optimum code performance of the underlying conventional convolutional code, the burst length B of the PCCB should satisfy Ti $B = 2K + mk$ (4)

where, K, k and m are as defined above.

As stated earlier, the apparatus and method of the present invention is applicable to any performance-level conventional convolutional code having any constraint length and any code rate, and is also applicable to conventional convolutional codes utilizing the Viterbi algorithm or other decoding techniques. However, it may be necessary for B to contain several (perhaps six or more) constraint lengths when Viterbi decoding is employed. This restriction on B is not severe since K is usually small (less than 15) for codes suitable for Viterbi decoding.

Figure 5:
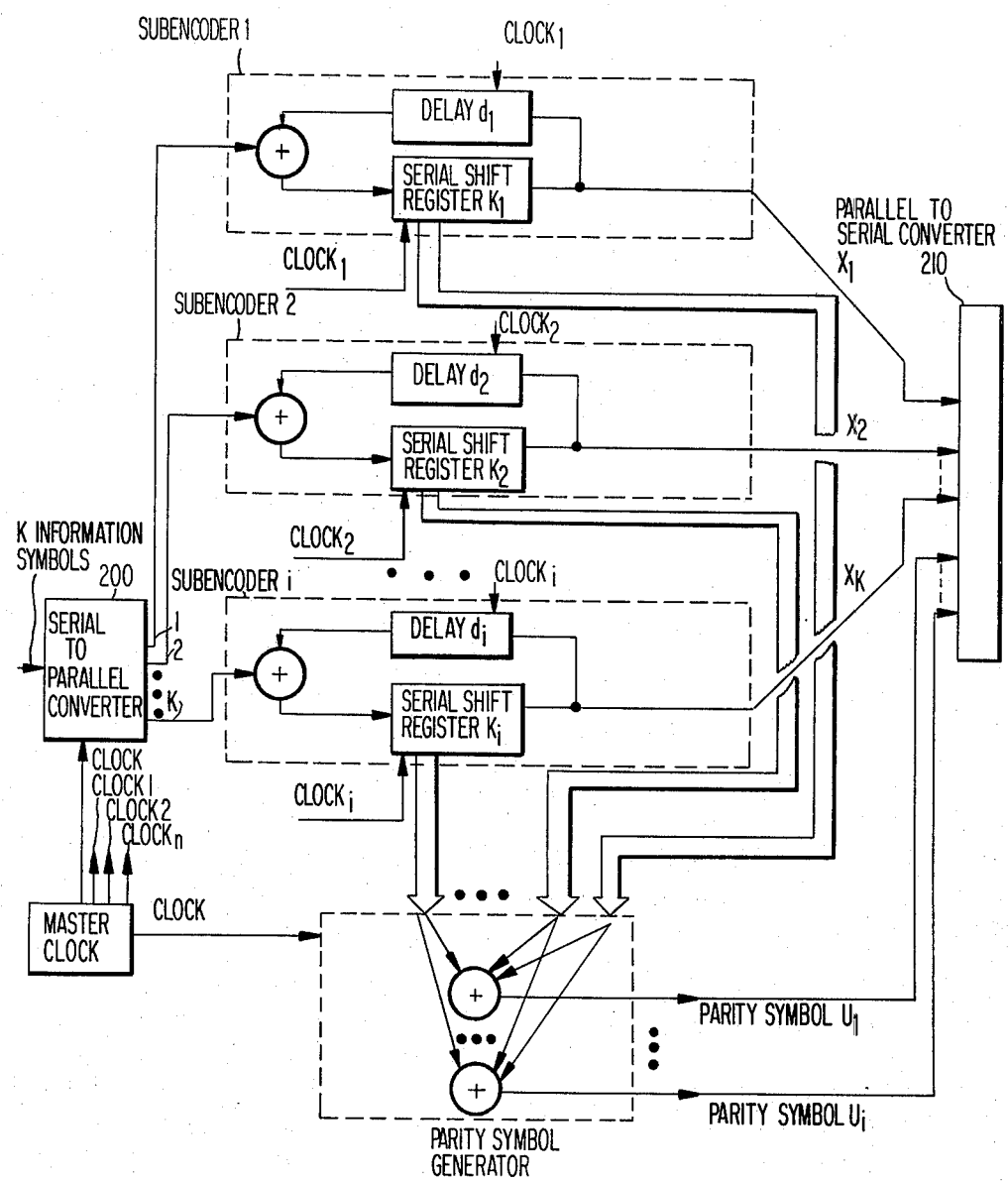
FIG. 5 is a block diagram of a generalized encoder according to the present invention.

Shown in FIG. 5 is a block diagram of a generalized encoder which will now be described. This encoder is essentially a plurality of subencoders operating in parallel, each being substantially identical to the encoder shown in FIG. 1.

For a code rate of $\rho = k/n$, the serial stream is split into k parallel streams 1, 2, ... k, by a serial-to-parallel converter 200.

Each of the k bit streams is input into a separate subencoder of the type shown in FIG. 1 having shift registers of length $K_1 = K/k$, where K is the constraint length of the code measured in information bits.

Certain taps from each shift register are input to $r = n - k$ modulo-2 adders $26_1 - 26_r$ that are used to generate parity symbols. Each of the r adders has $(d-1)/r$ inputs from each of the k registers. During each encoding step, the adders produce $r = n - k$ parity symbols from r modulo-2 sums of certain information bits that are in the registers. The k information bits output from the registers plus the $r = n - k$ generated parity symbols constitute a block of n code symbols that is output during each encoding step.

Parallel-to-serial converter 210 is used to multiplex the output code blocks into a single or serial stream.

Without feedback of the k register outputs, the encoding would produce a conventional convolutional code. Decoding of any bit requires the reception of information and parity symbols that occurred up to one constraint length before the bit that is to be decoded. Thus, encoding a bit stream of finite length B so that it could be decoded would require the generation of a number of overhead symbols equal to the constraint length of the code measured either in information bits K or in parity symbols $R = N - K$, where $N = K/\rho$ is the constraint length measured in code sybmols.

With $B_1 = B/k$, each of k streams input separately to the k encoder registers are of finite length $B_1$. By delaying the feedback by $D_1 = B_1 - K_1$ symbols, the old information symbols begin to reenter the inputs of the shift registers on the $(B_1+1)$th encoding step just when the information streams of length $B_1$ have already been input. Thus, the old information bits that are fed back in PCCB act as a continuation of the information stream and can thus be used in lieu of otherwise requiring overhead symbols to continue the input for K symbol intervals after the last of the B source bits have entered the encoder.

Figure 6:
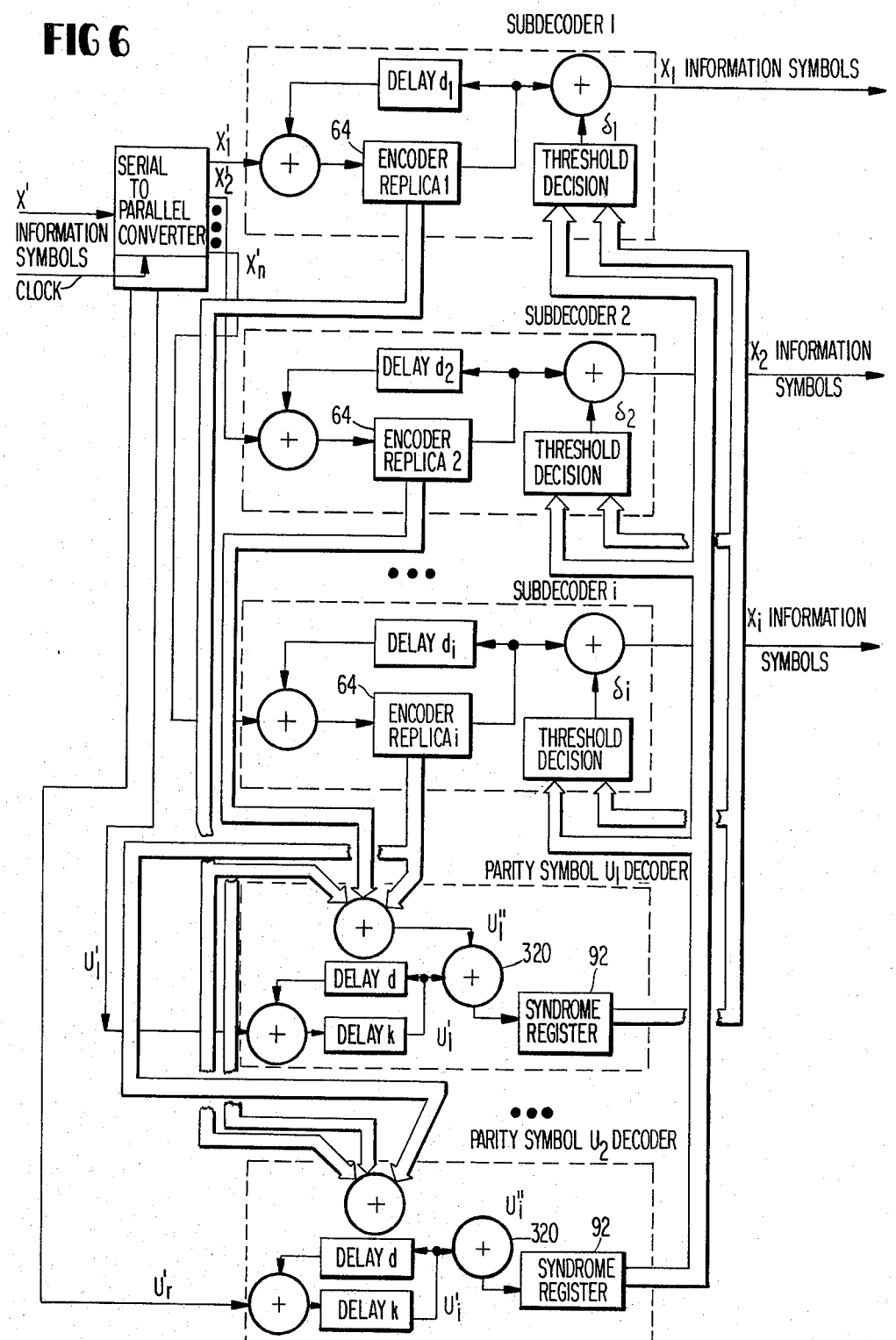
FIG. 6 is a block diagram of a generalized decoder according to the present invention.

Shown in FIG. 6 is a block diagram of a generalized decoder which will now be described. It consists essentially of k subdecoders operating in parallel, each being substantially identical to the decoder of FIG. 3.

A detected serial code stream is multiplexed by serial-to-parallel converter 300 into n parallel streams that include the k information symbol sequences and the $r = n - k$ parity symbol sequences. The k information streams are input to k registers in a configuration that is identical to the encoder. This encoder replicas 64 are used to regenerate the r parallel parity symbol sequences from the k detected information bit sequences.

Each of the $r = n - k$ detected parity sequences is first delayed by $K_1$ symbols. These delays allow the detected parity symbols to be time aligned with the corresponding k regenerated parity symbol sequences. Then, r modulo-2 adders 320 are used to generate r syndrome bit sequences from the comparison of the detected parity symbols with their values obtained by regenerating them from the detected information bits. In the absence of detection errors, the detected parity symbols will always be in agreement with their corresponding regenerated parity symbols. Hence, all syndrome bits have "0" logical values in the absence of detection errors. Syndrome bits are stored in r syndrome registers 92. Detection errors result in "1" values for some of the syndrome bits, and the locations of these syndrome bits with "1" value are used to determine which detected information bits should be "corrected" by the decoder.

In majority decoding of a convolutional FEC code that is systematic and has a Hamming distance d, the syndrome bits plus the detected information bit are used to provide d independent estimates of the bit. If the majority decision disagrees with the detected value, then a correction value of "1" is used in a modulo-2 sum with the detected bit to yield the corrected value.

Conversion of the convolutional decoder to PCCB requires only the feedback with delay of the k registers of the encoder replica and the r registers for the detected parity symbols. Each of these registers is of length $K_1 = K/r$, where K is the constraint length of the code measured in information bits. The delay in each of the $n = k + r$ feedback paths is $D_1 = B_1 - K_1$, where $B_1 = B/k$ and B is the length of the finite information bit sequence.

k threshold decision devices are used to generate the correction symbols $\delta$ for the k parallel bit streams. The decision device for each of the k bit streams has inputs from taps off of the r syndrome registers (each of length $K_1$). The tap connections are the mirror images of the connections on the encoder registers for each bit stream to the r modulo-2 adders used to generate the parity symbols.

This method and apparatus eliminates the overhead bits required to convolutionally encode and decode a digital data bit stream of finite length. During each encoding step for a binary convolutional code of rate $p=k/n$, a block of k input bits is input to the encoder, which then produces a block on n output binary code symbols. For a systematic code, k of these code digits are simply the k input information bits. The other $r=n-k$ code digits of the block are termed parity symbols. Each parity symbol is the modulo-2 sum of some of the bits of the present input block and of some bits in previous blocks. If the encoder takes into account only bits in the present block and the previous $K_1-1$ blocks, then the constraint length of the code is said to be $K=kK_1$ information bits or $N=nK_1$ binary code symbols. In terms of parity symbols, the constraint length is $R=N-K$.

The encoded bit stream in the PCCB format consists of $B_1$ blocks of n code symbols. As in conventional convolutional decoding, the PCCB decoder contains a replica of the encoder that is used to generate replicas of the parity symbols from the received information symbols. For PCCB, k shift registers of the encoder replica also have feedback with delay $D_1=B_1=K_1$ bit intervals each. Syndrome bits are obtained by the use of modulo-2 addition that compares the replicas of parity symbols with the received values of the parity symbols. For PCCB decoding, each of $r=n-k$ received parity symbols in each code block of length n must be delayed by $K_1$ bit intervals before being input to the $r=n-k$ adders that produce the syndrome bits.

Conventional convolution, which does not employ delay and feedback of previous outputs, requires some overhead in the amount of S bits in order to encode and decode a binary data stream of finite length. The required overhead S is the smaller of two values: K, the code constraint length measured in information bits or $R=N-K$, the constraint length expressed in parity symbols. By the use of delay and feedback to convert conventional convolution to circular convolution, PCCB coding avoids this overhead requirement. With PCCB coding with a code of constraint length $K=kK_1$ and a code rate of $p=k/n$, bursts of B information bits can be handled without any extra overhead as long as $B \geq 2K$ and varies in steps of k. That is, PCCB coding is effective without extra overhead to convert a convolutional FEC code to block lengths of $B=2K+mk$, where m is any non-negative integer.

What is claimed is:

1. In a method of encoding a bit stream of $B_1$ information symbols in a convolutional encoder of the type in which said bits are serially fed through a $K_1$ stage shift register and in which r parity symbols are generated for every k information symbols to achieve a code rate of $p=k/n$ defined as the ratio of the number of information symbols k to the total number of symbols n in the code, where $n=k+r$, the improvement comprising feeding back the output of said encoder shift register with a delay $D_1=B_1-K_1$ to the input of said shift register by re-introducing the first $K_1-1$ information symbols into the encoder shift register.

2. The method according to claim 1 wherein $B_1=2K_1+mk$, where m is any non-negative integer.

3. A method according to claim 1 further comprising the steps of:
   (a) converting a serial stream of B information symbols into k parallel streams each containing $B_1$ serial information symbols;
   (b) feeding each of said k parallel bit streams through a respective one of k shift registers each having $K_1$ stages and a feedback with delay $D_1=B_1-K_1$;
   (c) combining selected bits from each of said k shift registers in each of r modulo-2 adders to generate r new parity symbols each time the information symbols in said shift registers are shifted; and
   (d) combining the outputs of said k shift registers and the t outputs of said modulo-2 adders to thereby convolutionally encode a block of $B=kB_1$ information symbols with a code rate $p=k/n$ and a constraint length $K=kK_1$.

4. The method according to claim 1 wherein said information symbols comprise at least a portion of a time division multiple access (TDMA) burst.

5. In a method of decoding a periodic convolutional code block (PCCB), of block length $B_1$ of the type in which $B_1$ information symbols are received and fed through an encoder replica shift register of length $K_1$, new parity symbols are generated from said encoder replica shift register and compared with received parity symbols which are fed through a delay $K_1$, and the comparison results are fed through a syndrome register, the contents of which determine whether or not correction of the information symbol presently at the output of said encoder replica shift register is necessary, the improvement comprising feeding back the outputs of said encoder replica shift register and said delay $K_1$ to its respective input with a delay $D_1=B_1-K_1$.

6. The method according to claim 4 wherein $B_1=2K_1+mk$, where m is any non-negative integer.

7. The method according to claim 4 wherein said PCCB includes r parity symbols for every k information symbols and has a code rate $p=k/n$, where $n=k+r$ is the total number of symbols in each code block, said method further comprising the steps of:
   (a) converting a serial stream of received B information symbols into k parallel streams each containing $B_1$ serial received information symbols;
   (b) feeding each of said parallel bit streams through a respective one of k encoder replica shift registers each having $K_1$ stages and a feedback with delay $D_1=B_1-K_1$;
   (c) combining selected bits from each encoder replica shift register in each of r modulo-2 adders to generate r new parity symbols each time the received information symbols in said encoder replica registers are shifted;
   (d) supplying r serial streams of received parity symbols each through a respective delay $K_1$;
   (e) comparing the newly-generated parity symbols at the output of each modulo-2 adder with the corresponding received parity symbol at the output of an associated delay $K_1$, the results of the comparisons being provided to r syndrome registers; and
   (f) feeding back the outputs of each said delay $K_1$ and each said encoder replica shift register to its respective input with a delay $D_1=B_1-K_1$ to thereby decode a PCCB having block length $B=kB_1$ and constraint length $K=kK_1$.

8. The method according to claim 4 wherein said PCCB comprises at least a portion of a TDMA burst.

9. An apparatus for convolutionally encoding $B=kB_1$ information symbols, where k is any positive integer, said apparatus of the type having k encoder shift registers each of length $K_1$ for receiving and outputting $B_1$ information symbols, r modulo-2 adders each receiving selected bits from each of said k shift registers to generate r parity symbols each time the information symbols in said encoder registers are shifted, and combining means for combining the outputs of said k shift registers and r adders to provide a code having block length $B=kB_1$, constraint length $K=kK_1$ and a code rate of $\rho=k/n$, where $n=k+r$, said apparatus further comprising:

(a) feedback means for feeding back the output of said encoder shift register to its input; and (b) delay means for delaying said feedback by $D_1=B_1-K_1$.

10. An apparatus according to claim 9 wherein $B=2K+mk$, where m is any non-negative integer.

11. An apparatus according to claim 9 wherein said delay means is variable.

12. An apparatus for decoding a PCCB having a block length of $B=kB_1$ information symbols, constraint length $K=kK_1$ and code rate $\rho=k/n$ defined as the ratio of the number k of information symbols to the total number n of symbols in each code block, where $n-k=r$ is the number of parity symbols generated for every k information symbols, said apparatus having k encoder replica shift registers each of length $K_1$ for receiving $B_1$ information symbols, r modulo-2 adders for generating new parity symbols each time the information symbols in said encoder replica registers are shifted, r comparison means each for comparing said newly-generated parity symbols with received parity symbols, means for receiving r parallel streams of $B_1$ received parity symbols and providing them with delay $K_1$ to a respective one of said r comparison means, and r syndrome registers each for receiving outputs from a respective one of said r comparison means, said apparatus further comprising:

(a) feedback means for feeding back the outputs of each of said k encoder replica shift registers and said r delay means to their respective inputs; and (b) feedback delay means for delaying each of said feedback means by $D_1=B_1-K_1$.

13. The apparatus according to claim 12 wherein each said feedback delay means is variable.

14. The apparatus according to claim 12 wherein $B=2K+mk$, where m is any non-negative integer.

15. An apparatus according to claim 12 wherein $B=2K+mk$, where m is any non-negative integer.

* * * * *

UNITED STATES PATENT AND TRADEMARK OFFICE
CERTIFICATE OF CORRECTION

PATENT NO. : 4,293,951

DATED : October 6, 1981

INVENTOR(S) : Smith Albert Rhodes

It is certified that error appears in the above—identified patent and that said Letters Patent is hereby corrected as shown below:

IN THE SPECIFICATION:

Column 2, line 54 - change "336" to --338--

Column 4, line 37 - change "tion" to --tional--

Column 4, line 46 - change "particularly" to --particularity--

Column 6, line 45 - change "assum" to --assume--

Column 7, line 20 - change "stage" to --stages--

Column 8, line 23 - change "$U_o'$" to --$U'_o$-- line 23 - change "$U_{B-6}'$" to --$U'_{B-6}$-- line 46 - after "digital" insert --data--

Column 9, line 22 - delete "Ti"

UNITED STATES PATENT AND TRADEMARK OFFICE
CERTIFICATE OF CORRECTION

PATENT NO. : 4,293,951

DATED : October 6, 1981

INVENTOR(S) : Smith Albert Rhodes

It is certified that error appears in the above—identified patent and that said Letters Patent is hereby corrected as shown below:

Column 10, line 2 - change "sybmols" to --symbols--

IN THE CLAIMS:

Column 11, line 24 - change "$D_1 = B_1 = K_1$" to --$D_1 = B_1 - K_1$--

Signed and Sealed this

Twenty-sixth Day of January 1982

[SEAL]

Attest:

GERALD J. MOSSINGHOFF

*Attesting Officer*  *Commissioner of Patents and Trademarks*